United States Patent
Bhattacharya et al.

(10) Patent No.: US 7,183,642 B2
(45) Date of Patent: Feb. 27, 2007

(54) ELECTRONIC PACKAGE WITH THERMALLY-ENHANCED LID

(75) Inventors: Anandaroop Bhattacharya, Phoenix, AZ (US); Varaprasad V. Calmidi, Vestal, NY (US); Sanjeev B. Sathe, Johnson City, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/241,994

(22) Filed: Sep. 11, 2002

(65) Prior Publication Data

US 2004/0046249 A1    Mar. 11, 2004

(51) Int. Cl.
*H01L 23/36* (2006.01)
*H01L 23/34* (2006.01)
*H01L 31/024* (2006.01)

(52) U.S. Cl. .............. 257/717; 257/713; 257/712; 257/675; 257/E23.08; 257/E23.101

(58) Field of Classification Search .......... 257/701, 257/704, 706, 707, 712, 713, 717, 720, 718, 257/675, 796, E23.08, E23.051, E23.105, 257/E23.101, E23.087, E23.083
See application file for complete search history.

(56) References Cited

U.S. PATENT DOCUMENTS

| | | | | |
|---|---|---|---|---|
| 5,532,513 | A * | 7/1996 | Smith et al. | 257/703 |
| 5,585,671 | A * | 12/1996 | Nagesh et al. | 257/697 |
| 5,742,007 | A * | 4/1998 | Kornowski et al. | 174/52.3 |
| 6,091,603 | A * | 7/2000 | Daves et al. | 361/704 |
| 6,294,408 | B1 * | 9/2001 | Edwards et al. | 438/121 |
| 6,409,859 | B1 * | 6/2002 | Chung | 156/69 |
| 6,501,171 | B2 * | 12/2002 | Farquhar et al. | 257/706 |
| 6,512,295 | B2 * | 1/2003 | Gaynes et al. | 257/738 |
| 6,742,007 | B1 * | 5/2004 | Oshiama et al. | 708/230 |
| 2002/0113306 | A1 * | 8/2002 | Kwon et al. | 257/691 |

FOREIGN PATENT DOCUMENTS

JP        10-041444     *  2/1998  ........... 23/373

* cited by examiner

*Primary Examiner*—Evan Pert
*Assistant Examiner*—Victor A. Mandala, Jr.
(74) *Attorney, Agent, or Firm*—Connolly Bove Lodge & Hutz LLP

(57) ABSTRACT

Removing heat generated by an operating IC chip from both the chip and the electronics package containing the chip is essential for proper system operation and to increase the life of the electronics package. Using an air permeable lid with the electronic package increases the heat transfer away from the IC chip and electronics package, thereby cooling the chip and the package.

9 Claims, 5 Drawing Sheets

ELECTRONIC PACKAGE WITH THERMALLY-ENHANCED LID

TECHNICAL FIELD

The present invention relates to a structure that exhibits increased heat transfer from an integrated circuit chip during circuit operation, as well as, a method for increasing such heat transfer. More particularly, the present invention employs a thermally conductive permeable lid.

BACKGROUND OF THE INVENTION

During operation of an integrated circuit (IC), an IC chip generates heat, thus heating the entire electronics package that contains the chip. Because the performance of the IC chip degrades as its temperature increases, and because high thermal stresses degrade the structural integrity of the electronics package, this heat must be dissipated. Many electronic packages use a metal lid which is non-permeable to air for this required heat dissipation. The heat from the chip is transferred to the metal lid via a thermally conductive chip/lid interface. The heat is then transferred from the lid to the ambient atmosphere via convection. Increasing the heat dissipating ability of the metal lid is an ongoing design concern in electronic packaging design.

SUMMARY OF THE INVENTION

The present invention relates to a structure and method for increasing the heat transfer from an IC chip during circuit operation by replacing the non-permeable lid used in electronic packaging with a thermally conductive permeable lid. Using this thermally conductive permeable lid increases the transfer of heat away from the IC chip during operation, thus cooling the chip and the surrounding electronics package.

Other objections and advantages of the present invention will become readily apparent to those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description and drawings are to be regarded as illustrative in nature and not as restrictive.

DESCRIPTION OF BEST AND VARIOUS EMBODIMENTS FOR CARRYING OUT INVENTION

The preferred embodiments of the present invention will be described in relation to a ball grid array (EGA) single flip chip (FC) electronic package design. However, the structures and methods discussed are applicable to many types of electronics packaging, and such structures and methods are not limited solely to the BGA FC electronic package design. For example, the thermally conductive lid described herein can be used with the wire bonded electronic package design, which is well known in the art. Additionally, the thermally conductive lid described herein can be used with a multi-chip package design (i.e., several chips mounted on a substrate).

Figure 1:
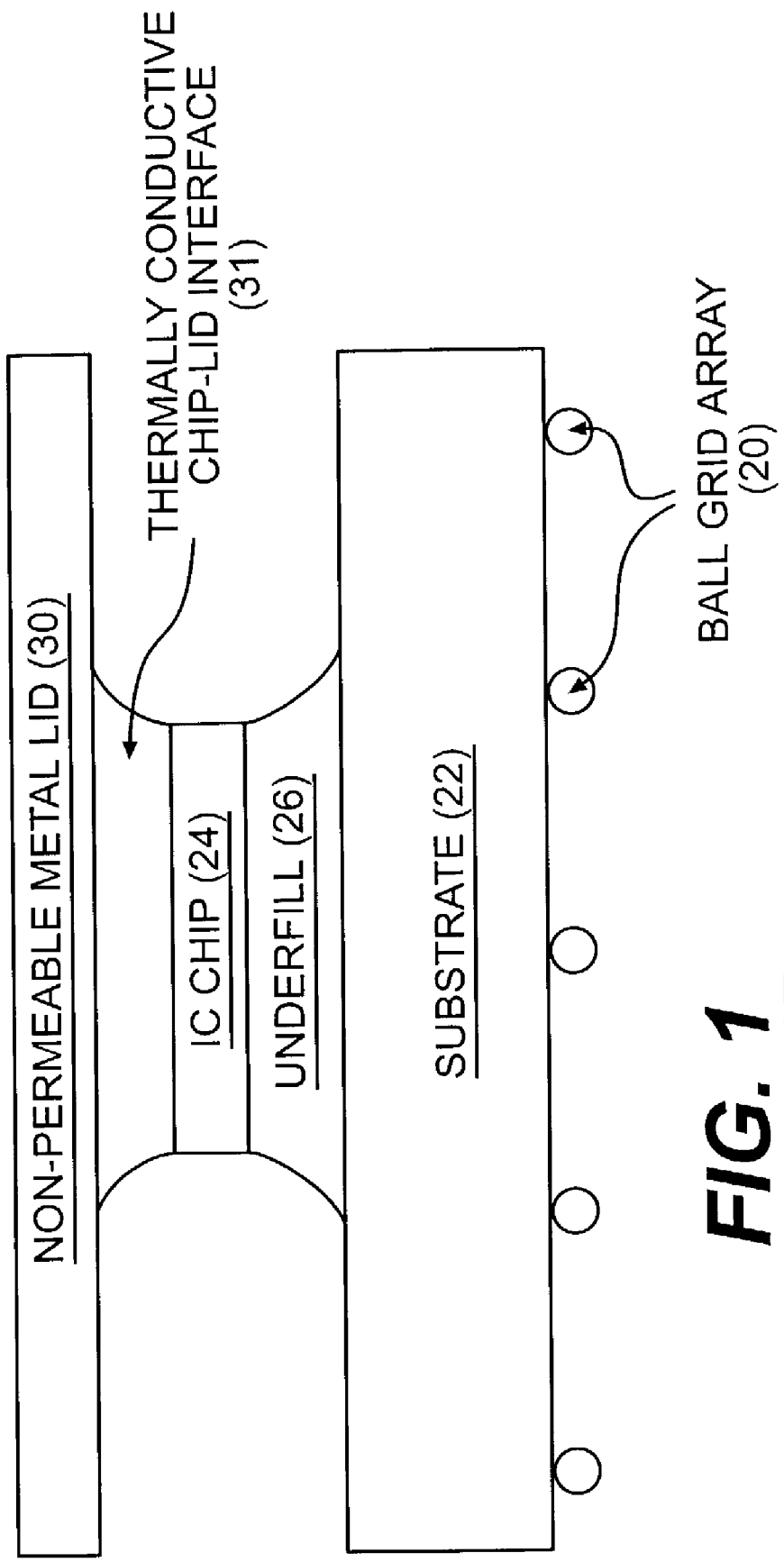
FIG. 1 shows a cross-sectional view of a known structure of a Ball Grid Array (BGA) Flip-Chip (FC) electronic package.

FIG. 1 shows a BGA FC structure containing a ball grid array (20), upon which is attached a substrate (22). The IC chip (24) is attached to the substrate (22) by any of several variations of known bonding methods and materials well known for use in this "flip chip" attachment method. (FIG. 1 does not show this IC chip/substrate bond). After the connection is made between the IC chip (24) and the substrate (22), underfill (26) is introduced in the vicinity of the chip/substrate bond, providing mechanical strength to the bond and minimizing the effect of the differing coefficients of thermal expansion between the substrate (22), the bonding material, and the IC chip (24).

The IC chip generates heat during operation, thus imparting this heat to the surrounding materials that make up the electronic package. This heat must be dissipated in order to increase both the operational performance and the structural integrity of the package. Specifically, heat dissipation is required for two reasons.

First, heat must be dissipated in order to ensure that the temperature of the chip does not exceed its maximum operating limit.

Secondly, the heating/cooling cycles of the package, as the package is energized and de-energized throughout its life cycle, places mechanical stresses on the bonds holding the various components together. This is because the materials making up the package (e.g., the materials comprising the IC chip, the FC bonding material, and the substrate) have varying coefficients of thermal expansion. Simply put, for a given heat input, the package materials heat up and cool down at varying rates. Because a material expands when it heats up and contracts when it cools down, these varying heatup and cooldown rates, and the resulting non-uniform expansion and contraction of the package materials, places thermal stresses on the bonds between these materials. Minimizing the temperature of the chip and the packaging reduces these thermal stresses.

Often, prior art electronics packages used a metal lid (30) for dissipating heat. The metal lid (30) is placed in thermal contact with the IC chip. That is, the metal lid (30) is placed physically in relation to the IC chip such that the heat generated by the IC chip is transferred to the metal lid, where ambient air can carry the heat from the lid. This heat transfer from IC chip to lid can be effected by conduction (i.e., the IC chip and the lid are connected physically by a thermally conductive interface). This thermally conductive interface can be comprised of several materials known in the art, such as filled silicones and thermal epoxies, for example.

FIG. 1 shows a metal lid (30) in thermal contact with the IC chip (24) via a thermally conductive chip/lid interface (31). The heat generated by the IC chip (24) during operation is transferred to the metal lid (30) via conduction through the thermally conductive chip/lid interface (31). The heat from the lid is then transferred to the ambient air via convection.

The metal lid (30) currently used in electronic packages is not permeable to air. It is an object of the present invention to enhance the heat dissipation from an electronic package by replacing this solid metal lid (30) with a metal lid permeable to air (i.e., a thermally conductive permeable lid). This thermally conductive permeable lid allows ambient air to come into contact with a greater surface area of heat transfer surface in the lid, thus providing a better heat sink for the electronic package. Because of the better heat transfer characteristics of the thermally conductive permeable lid over the non-permeable lid, the thermally conductive lid provides better dissipation of heat from the electronic package during operation.

The thermally conductive permeable lid can be made from any process known in the art that results in a metal having a "mesh" characteristic; that is, showing a continuously connected, open-celled (reticulated) geometry. The thermally conductive permeable lid can take the form of, for example, metal foam, wire mesh, or metal sponge material. The preferred embodiment is foam metal with an open-cell structure. The thermally conductive permeable lid can be constructed from any metal or material that demonstrates the proper heat transfer characteristics and can be worked or formed into the proper reticulated geometry. Copper or aluminum are the preferred materials from which to construct the thermally conductive permeable lid. The thermally conductive permeable lid can also be comprised of any thermally conductive material such as ceramic or carbon. The thermally conductive permeable lid can also be constructed from a metal plate by creating holes through the metal plate that allow the passage of air through the plate.

Figure 2:
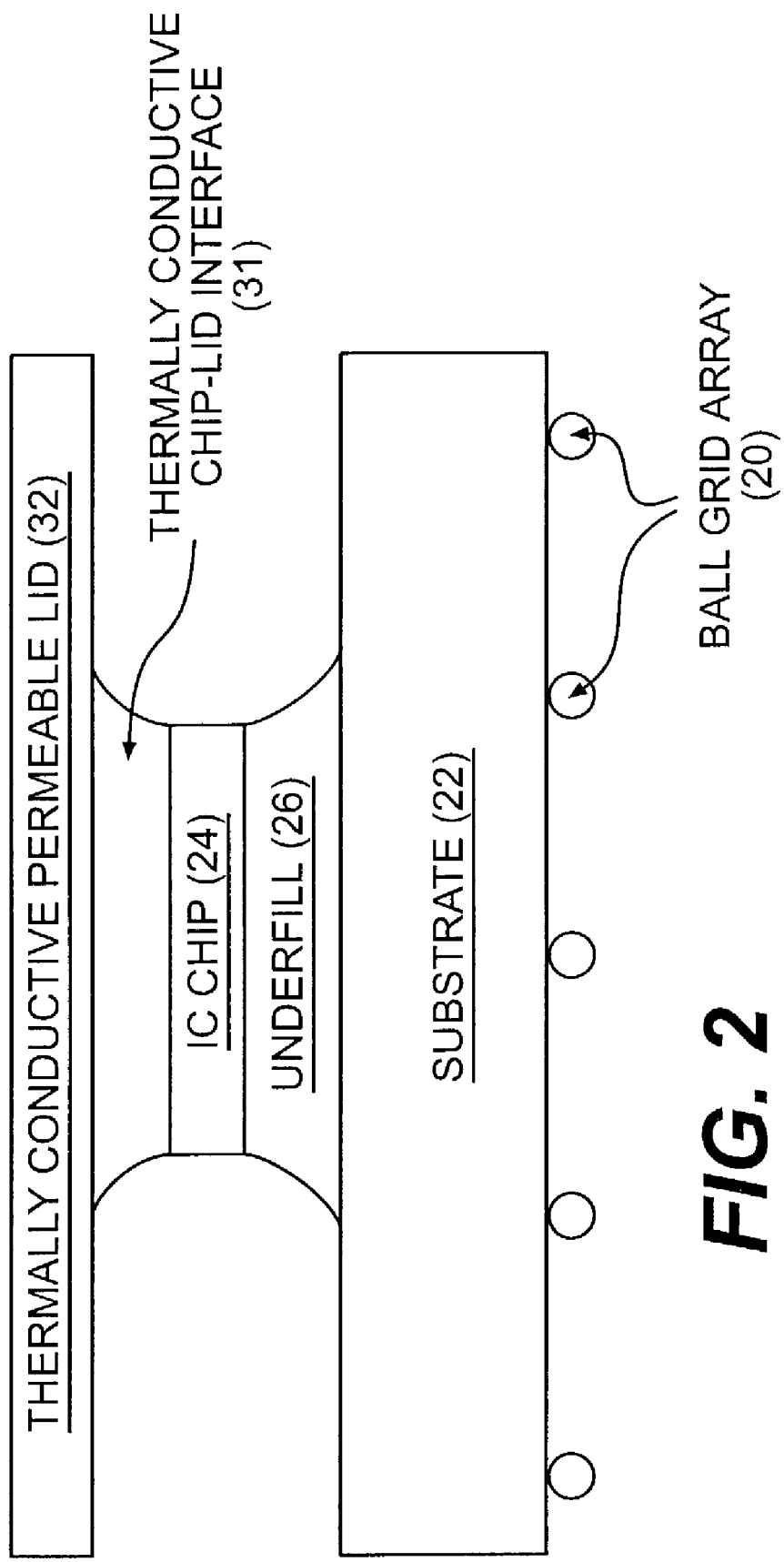
FIG. 2 shows a cross-sectional view of an electronics package in accordance with one embodiment of the present invention.

FIG. 2 shows the structure of the electronics package of one embodiment of the present invention. The structure of the package is similar to the structure shown in FIG. 1, except that the non-permeable metal lid (30) has been replaced with a thermally conductive permeable lid (32). The thermally conductive permeable lid (32) is then attached as shown in FIG. 2 to the IC chip (24) via the thermally conductive chip/lid interface (31). The heat generated by the IC chip (24) during operation is then transferred to the thermally conductive permeable lid (32) via conduction through the thermally conductive chip/lid interface (31). The heat from the thermally conductive permeable lid (32) is then transferred to the ambient air via convection.

Figure 3:
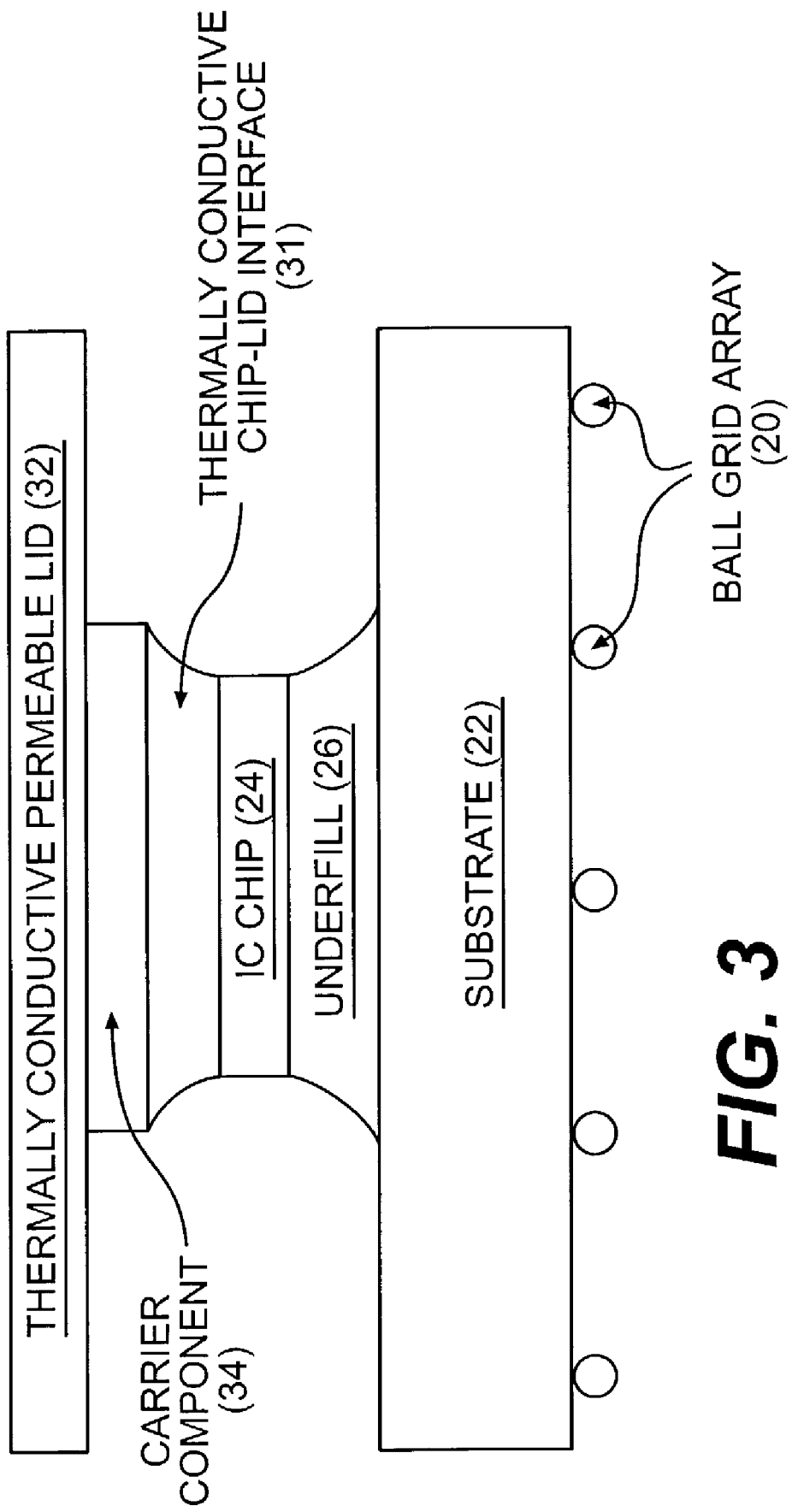
FIG. 3 shows a cross-sectional view of an electronics package in accordance with a second embodiment of the present invention.

FIG. 3 shows the structure of the electronic package of a second embodiment of the present invention. This embodiment comprises the thermally conductive permeable lid (32) shown in FIG. 2. However, between the thermally conductive permeable lid (32) and the thermally conductive chip/lid interface (31) has been inserted a carrier component (34). This carrier component can comprise copper or any other material with the proper heat conduction characteristics. Its purpose is to act as a heat spreader as well as to increase the structural stability of the thermally conductive permeable lid (32). The carrier component (34) is attached to the thermally conductive permeable lid (32) by means of adhesion, brazing, or any other suitable attachment method. The carrier component (34) can be of any length between the length of the chip (24) and the length of the thermally conductive permeable lid (32).

FIG. 3 shows the embodiment in which the length of the carrier component (34) is equal to the length of the chip. The heat generated by the IC chip (24) during operation is then transferred to the thermally conductive permeable lid (32) via conduction through the thermally conductive chip/lid interface (31) and the carrier component (34). The heat from the lid is then transferred to the ambient air from the thermally conductive permeable lid (32) via convection.

Figure 4:
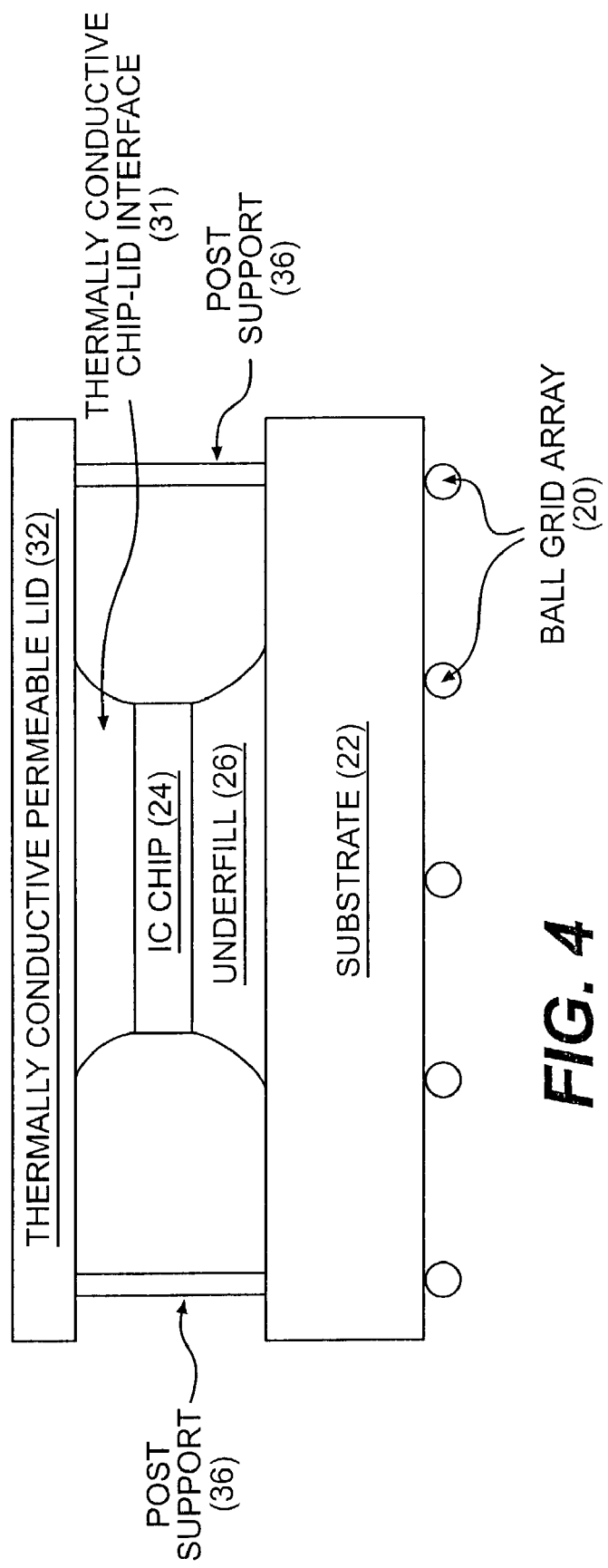
FIG. 4 shows a cross-sectional view of an electronic package in accordance with a third embodiment of the present invention.

FIG. 4 shows the structure of the electronic package of a fourth embodiment of the present invention. In this embodiment, the thermally conductive permeable lid (32) is further supported by individual supports (36). The individual supports (36) are physically connected at one end to the substrate (22) and at a second end to the thermally conductive permeable lid (32). These supports (36) help support the weight of the thermally conductive permeable lid (32). These supports (36) can be either discrete individual posts (shown in FIG. 4) or an annular ring around the chip (not shown).

Figure 5:
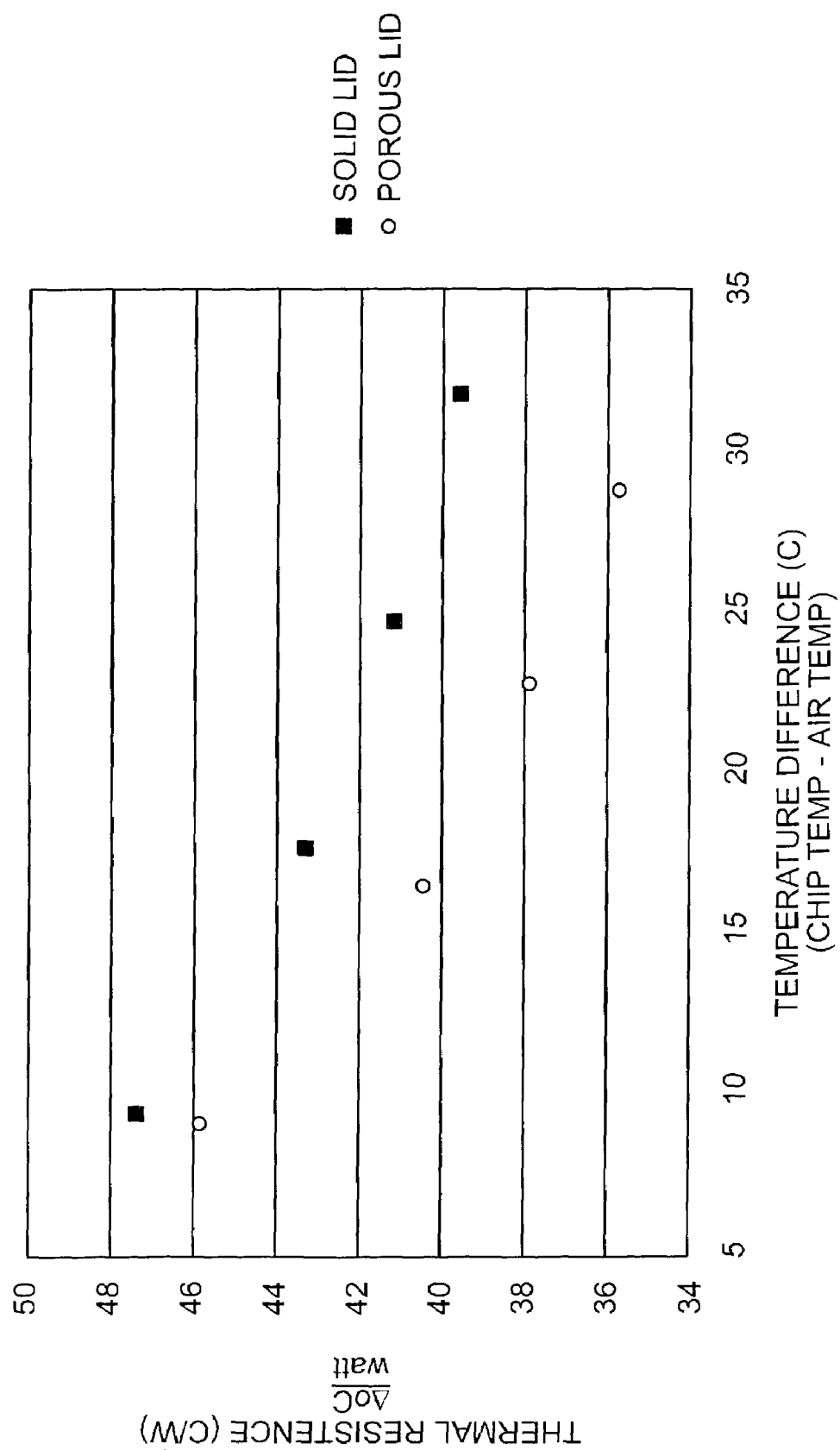
FIG. 5 shows the plot of thermal resistance as a function of chip/ambient temperature difference for both a solid lid and a permeable lid.

FIG. 5 shows the results of an experiment performed that demonstrated the better heat transfer characteristics of a thermally conductive permeable lid compared to a solid lid under natural convection conditions. The experiment was performed using a heated copper block to simulate an IC chip. The simulated chip has dimensions of 18 mm×19 mm. A copper lid of dimensions 40 mm×40 mm, simulating the electronic package lid, was placed in proximity to the simulated chip. The bottom of the heated chip (i.e., the side not adjacent to the simulated lid) was insulated to ensure that all heat transferred from the simulated chip flowed out through the simulated lid. The "chip-to-air" thermal resistance under natural convection was determined as a function of the difference between the maximum temperature on the simulated chip and the ambient air temperature. In a first instance the simulated lid was comprised of non-permeable copper at a thickness of 3 mm. In a second instance, the simulated lid was comprised of permeable copper at a thickness of 3 mm. FIG. 5 shows that, at a temperature difference of 30° C., the chip-to-ambient thermal resistance was improved by 10% in this example.

For many "high density" applications (e.g., small card area available for heat transfer or several densely-packed modules on a card), most of the heat dissipation by heat transfer from the chip to the lid, and thence to the surrounding air. Thus, improving the ability of the electronic package lid to dissipate heat will allow the package to operate at a higher power level, and will, additionally, prolong the life of the components that make up the electronic package.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. An electronic package comprising:
   an IC chip;
   a thermally conductive, air-permeable lid, said lid comprising:
      a thermally-conductive material formed to have a reticulated geometry;
   a thermally conductive chip/lid interface; and
   a carrier component disposed between the thermally conductive IC chip/lid interface and the thermally conductive, air-permeable lid, wherein the length of the carrier component is equal to the length of the thermally conductive, air-permeable lid.

2. The electronics package of claim 1, farther comprising a means of supporting the thermally conductive permeable lid, wherein said means of support comprises a post, connected at a first end to the thermally conductive lid, and connected at a second end to a substrate of the electronics package.

3. The electronics package of claim 1, further comprising a means of supporting the thermally conductive permeable lid, wherein said means of support comprises an annular ring, connected at a point to the thermally conductive permeable lid.

4. The electronic package of claim 1, wherein said reticulated geometry comprises an open-celled, continuously-connected geometry.

5. The electronic package of claim 4, wherein said reticulated geometry consists of a geometry selected from a meshwork, a metal foam, a wire mesh, and a metal sponge.

6. A method for transferring heat away from an IC chip in an electronics package, comprising:
   providing a thermally-conductive, air-permeable lid, said lid comprising:
      a thermally-conductive material formed to have a reticulated geometry;
   providing an IC chip;
   positioning a carrier component between the thermally conductive, airpermeable lid and the IC chip, wherein the length of the carrier component is equal to the length of the thermally conductive, air-permeable lid, wherein said IC chip is in thermal connection with said carrier component which in turn is in thermal connection with said thermally-conductive, air-permeable lid ; and
   allowing air to contact the thermally-conductive, air-permeable lid; thus transferring heat from the IC chip.

7. The method of claim 6, where the means of placing an IC chip in thermal connection with a thermally conductive permeable lid comprises placing a thermally conductive IC chip/lid interface between the IC chip and the thermally conductive permeable lid.

8. The method of claim 6, wherein said reticulated geometry comprises an open-celled, continuously-connected geometry.

9. The method of claim 6, wherein said reticulated geometry consists of a geometry selected from a meshwork, a metal foam, a wire mesh, and a metal sponge.

* * * * *